(12) United States Patent
Yokoyama et al.

(10) Patent No.: US 11,302,569 B2
(45) Date of Patent: Apr. 12, 2022

(54) METHOD FOR MANUFACTURING SEMICONDUCTOR DEVICE AND SEMICONDUCTOR DEVICE

(71) Applicant: Mitsubishi Electric Corporation, Tokyo (JP)

(72) Inventors: Shuhei Yokoyama, Tokyo (JP); Seiya Sugimachi, Tokyo (JP); Maki Hasegawa, Tokyo (JP); Kosuke Yamaguchi, Tokyo (JP); Shogo Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 115 days.

(21) Appl. No.: 16/715,745

(22) Filed: Dec. 16, 2019

(65) Prior Publication Data

US 2020/0303237 A1    Sep. 24, 2020

(30) Foreign Application Priority Data

Mar. 19, 2019   (JP) .............................. JP2019-051337

(51) Int. Cl.
*H01L 21/768*   (2006.01)
*H01L 21/56*   (2006.01)
(Continued)

(52) U.S. Cl.
CPC .......... *H01L 21/768* (2013.01); *H01L 21/565* (2013.01); *H01L 23/3157* (2013.01); *H01L 23/522* (2013.01)

(58) Field of Classification Search
CPC ..... H01L 23/34; H01L 23/50; H01L 23/3157; H01L 23/522; H01L 21/565
See application file for complete search history.

(56) References Cited

U.S. PATENT DOCUMENTS

| | | | | |
|---|---|---|---|---|
| 4,912,546 A | * | 3/1990 | Fujita | ................ H01L 23/49503 257/676 |
| 9,006,871 B2 | * | 4/2015 | Fujisawa | ........... H01L 23/49568 257/676 |

(Continued)

FOREIGN PATENT DOCUMENTS

| | | |
|---|---|---|
| JP | S62-045054 A | 2/1987 |
| JP | H02-222568 A | 9/1990 |

(Continued)

OTHER PUBLICATIONS

An Office Action; "Notice of Reasons for Refusal," mailed by the Japanese Patent Office dated Feb. 22, 2022, which corresponds to Japanese Patent Application No. 2019-051337 and is related to U.S. Appl. No. 16/715,745; with English language translation.

*Primary Examiner* — Mohsen Ahmadi
(74) *Attorney, Agent, or Firm* — Studebaker & Brackett PC

(57) ABSTRACT

A method for manufacturing a semiconductor device according to the present invention includes the steps of (a) preparing a lead frame including a power chip die pad to which two terminals are connected, a control element die pad to which one terminal is connected, and tie bar portions connecting between a plurality of terminals including the two terminals, (b) placing a power chip and a free wheel diode on the power chip die pad and placing ICs on the control element die pad, (c) encapsulating in a mold resin to allow the tie bar portions to be exposed outside and a plurality of terminals including the two terminals and the one terminal to protrude outward, and (d) removing the tie bar portions other than the tie bar portions connecting the two terminals.

6 Claims, 15 Drawing Sheets

(51) Int. Cl.
  *H01L 23/522*   (2006.01)
  *H01L 23/495*   (2006.01)
  *H01L 23/31*    (2006.01)
  *H01L 25/07*    (2006.01)

(56)          References Cited

U.S. PATENT DOCUMENTS

| | | | |
|---|---|---|---|
| 2003/0141579 A1* | 7/2003 | Oda | H01L 24/97 |
| | | | 257/678 |
| 2016/0163615 A1 | 6/2016 | Mitamura et al. | |
| 2017/0345742 A1* | 11/2017 | Sakamoto | H01L 21/4853 |
| 2018/0040487 A1* | 2/2018 | Takahashi | H01L 23/28 |
| 2019/0333843 A1* | 10/2019 | Hiramitsu | H01L 23/49575 |
| 2019/0333909 A1* | 10/2019 | Sugita | H01L 23/473 |
| 2019/0385942 A1* | 12/2019 | Saegusa | H01L 23/49811 |

FOREIGN PATENT DOCUMENTS

| | | | | |
|---|---|---|---|---|
| JP | H03-250653 A | 11/1991 | | |
| JP | 2003-218309 A | 7/2003 | | |
| JP | 2016111088 A | 6/2016 | | |
| WO | WO-2019077874 A1 * | 4/2019 | | H01L 23/48 |

\* cited by examiner

F I G. 6
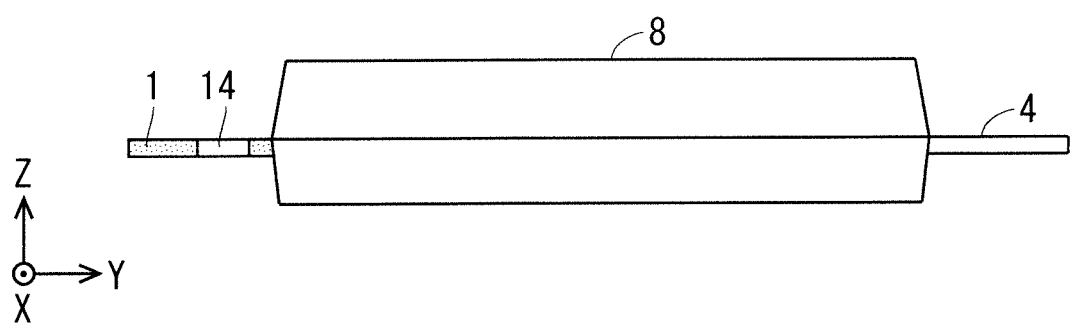

F I G. 8
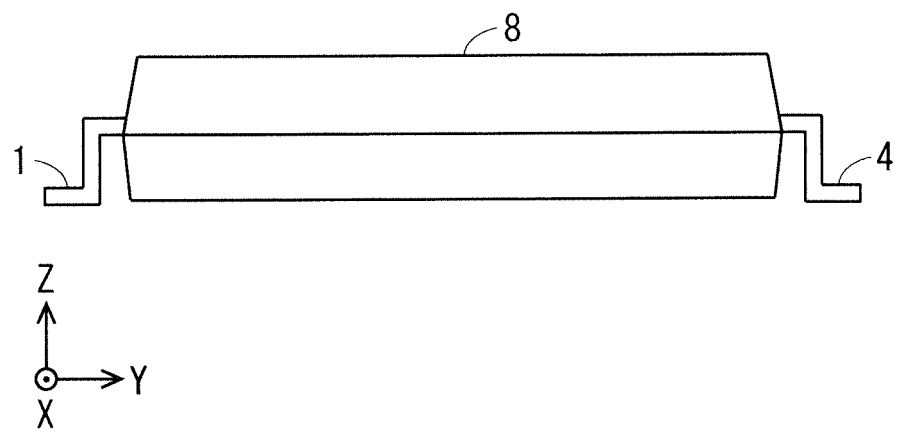

METHOD FOR MANUFACTURING SEMICONDUCTOR DEVICE AND SEMICONDUCTOR DEVICE

BACKGROUND OF THE INVENTION

Field of the Invention

The present invention relates to a method for manufacturing a semiconductor device and a semiconductor device.

Description of the Background Art

A conventional semiconductor device in which two terminals are connected to one die pad has been disclosed (see, for example, Japanese Patent Application Laid-Open No. 2016-111088).

When the semiconductor device disclosed in Japanese Patent Application Laid-Open No. 2016-111088 is used in high-power applications, it is necessary to increase a terminal pitch of a power-side terminal provided on the semiconductor device in order to secure an insulation distance and a spatial distance. Herein, the power-side terminal corresponds to a terminal connected to a die pad on which a power chip serving as a switching element is placed. When the terminal pitch of the power-side terminal is increased, it is necessary to provide a tie bar portion between the power-side terminals for manufacturing reasons, but to reduce flutters of the die pad, a connection width of a frame from the die pad to the tie bar portion needs to be increased. However, for machining reasons, it is necessary to set the connection width and the thickness of the power-side terminal equal to each other; thus, the larger the connection width is, the larger the thickness of the power-side terminal becomes. This makes it impossible to set the thickness of the power-side terminal and a thickness of a control-side terminal equal to each other. This prevents, when the semiconductor device is mounted on a substrate, a uniform stress from being applied to both the power-side terminal and the control-side terminal or solder from being uniformly fused at the power-side terminal and the control-side terminal, which results in a problem that the semiconductor device is less suitably mounted on the substrate. Herein, the control-side terminal corresponds to a terminal connected to a die pad on which an integrated circuit (IC) configured to control a power chip is placed.

SUMMARY

An object of the present invention is to provide a method for manufacturing a semiconductor device and a semiconductor device allowed to be more suitably mounted on a substrate.

A method for manufacturing a semiconductor device according to the present invention includes the steps of (a) preparing a lead frame including a switching element die pad to which two terminals are connected, the two terminals being disposed on a first side in plan view, a control element die pad to which one terminal is connected, the one terminal being disposed on a second side opposite to the first side, and tie bar portions connecting between a plurality of terminals including at least the two terminals, (b) placing a switching element and a diode element on the switching element die pad and placing, on the control element die pad, a control element configured to control the switching element, (c) encapsulating the switching element, the diode element, and the control element in a mold resin to allow the tie bar portions to be exposed outside and a plurality of terminals including the two terminals and the one terminal to protrude outward, and (d) removing the tie bar portions other than the tie bar portion connecting the two terminals.

The method for manufacturing a semiconductor device includes the steps of (a) preparing a lead frame including a switching element die pad to which two terminals are connected, the two terminals being disposed on a first side in plan view, a control element die pad to which one terminal is connected, the one terminal being disposed on a second side opposite to the first side, and tie bar portions connecting between a plurality of terminals including at least the two terminals, (b) placing a switching element and a diode element on the switching element die pad and placing, on the control element die pad, a control element configured to control the switching element, (c) encapsulating the switching element, the diode element, and the control element in a mold resin to allow the tie bar portions to be exposed outside and a plurality of terminals including the two terminals and the one terminal to protrude outward, and (d) removing the tie bar portions other than the tie bar portion connecting the two terminals, which makes it possible to more suitably mount the semiconductor device on a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the semiconductor device according to the first preferred embodiment of the present invention, showing the example of the process of manufacturing the semiconductor device;

FIG. 8 is a side view of the example of the semiconductor device according to the first preferred embodiment of the present invention;

DESCRIPTION OF THE PREFERRED EMBODIMENTS

Preferred embodiments of the present invention will be described below with reference to the drawings.

First Preferred Embodiment

Figure 1:
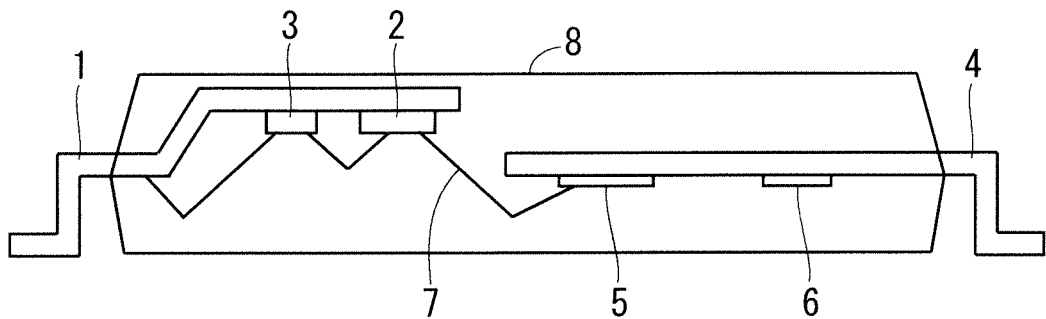
FIG. 1 is a cross-sectional view of an example of a structure of a semiconductor device according to a first preferred embodiment of the present invention.

FIG. 1 is a cross-sectional view of an example of a structure of a semiconductor device according to a first preferred embodiment.

As shown in FIG. 1, the semiconductor device includes a power chip 2 serving as a switching element, a free wheel diode 3 serving as a diode element, an IC 5 serving as a control element that controls the power chip 2, and a bootstrap diode 6. The power chip 2 and the free wheel diode 3 are placed on a die pad, and a power-side terminal 1 is connected to the die pad. The IC 5 and the bootstrap diode 6 are placed on a die pad, and a control-side terminal 4 is connected to the die pad. The power chip 2, the free wheel diode 3, and the IC 5 are connected by a wire 7.

Further, the power chip 2, the free wheel diode 3, the IC 5, and the bootstrap diode 6 are encapsulated in a mold resin 8. The power-side terminal 1 and the control-side terminal 4 protrude outward from opposite side surfaces of the mold resin 8.

As described above, the semiconductor device according to the first preferred embodiment is a power semiconductor device that is a surface-mount power package encapsulated in the mold resin 8 and is used in high-power applications.

Figure 2:
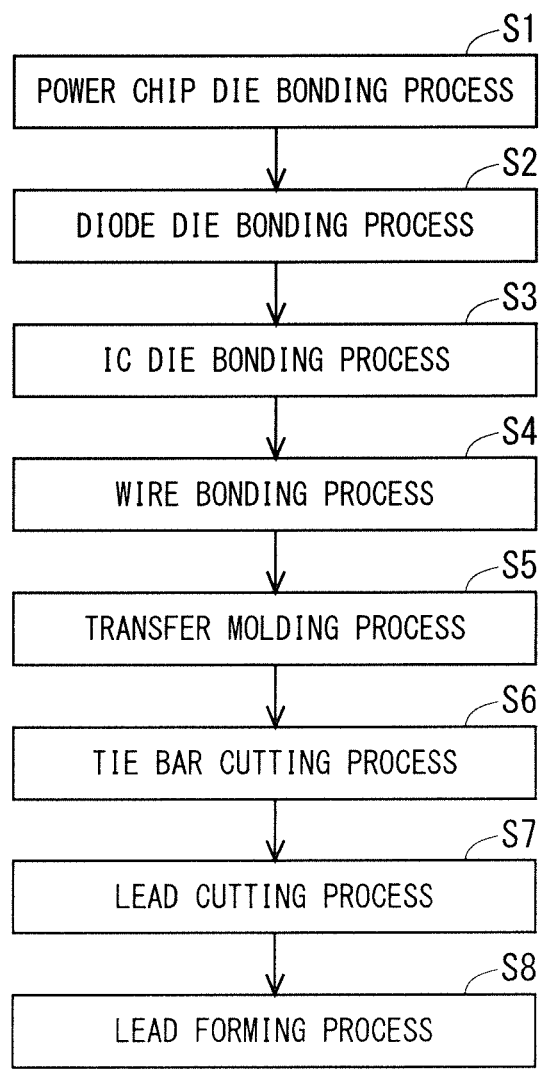
FIG. 2 is a flowchart of an example of a process of manufacturing the semiconductor device according to the first preferred embodiment of the present invention.

FIG. 2 is a flowchart of an example of a process of manufacturing the semiconductor device according to the first preferred embodiment. Note that the order of step S1, step S2, and step S3 described below is not limited to the order described below and may be any order.

Figure 3:
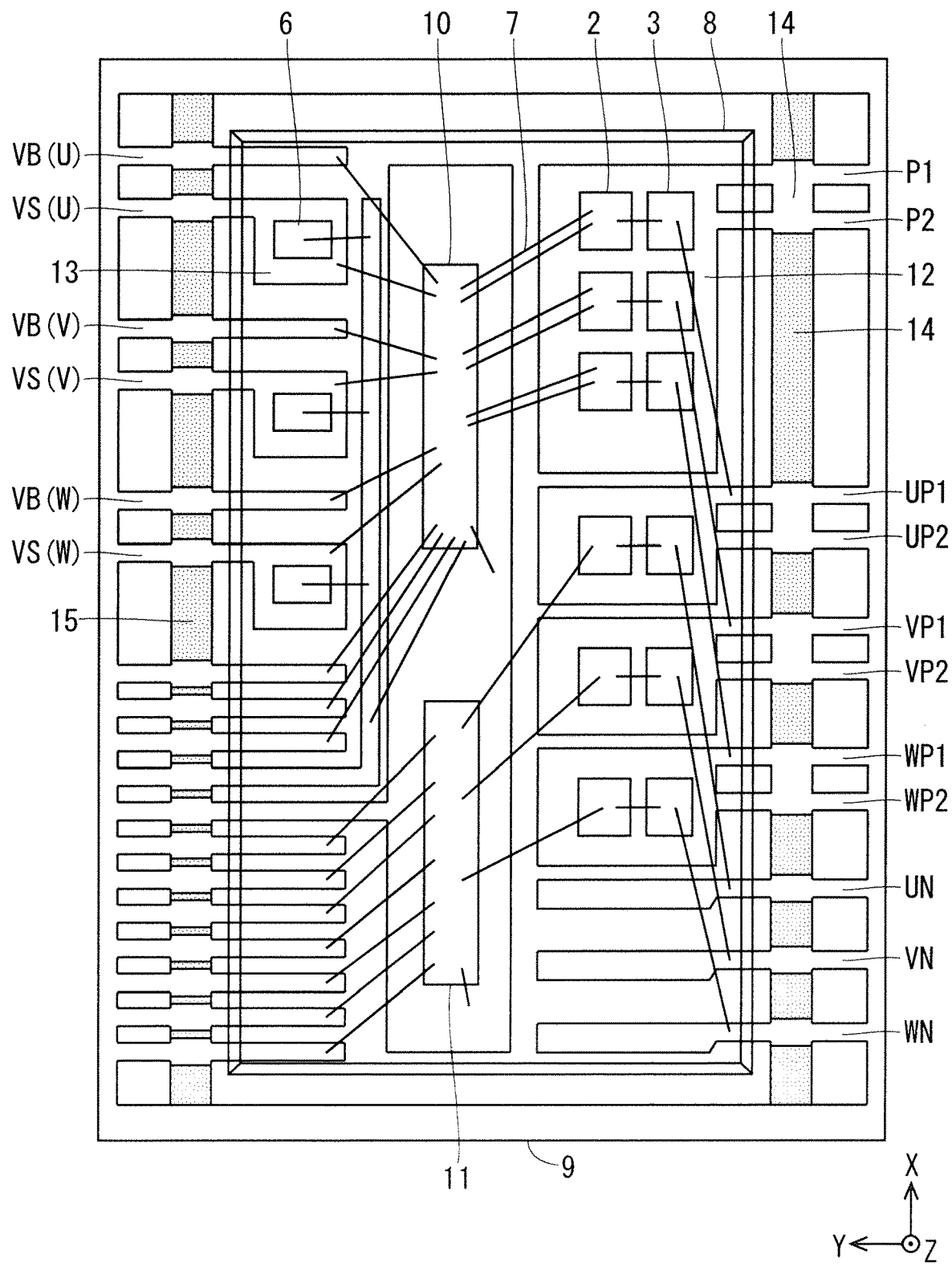
FIGS. 3 to 5 are plan views of the semiconductor device according to the first preferred embodiment of the present invention, showing the example of the process of manufacturing the semiconductor device.

In a power chip die bonding process in step S1, as shown in FIG. 3, the power chip 2 is placed on a power chip die pad 12 serving as a switching element die pad to electrically connect to the power chip die pad 12. In the example shown in FIG. 3, six power chips 2 are provided in a vertical direction of a paper surface. The power chip die pad 12 is a part of a lead frame 9.

In a diode die bonding process in step S2, as shown in FIG. 3, the free wheel diode 3 is placed on the power chip die pad 12 to electrically connect to the power chip die pad 12. In the example shown in FIG. 3, six free wheel diodes 3 are provided in the vertical direction of the paper surface. The power chip die pad 12 is a part of the lead frame 9.

Note that, in step S2, the bootstrap diode 6 may be placed on a control element die pad 13 to electrically connect to the control element die pad 13. In the example shown in FIG. 3, three bootstrap diodes 6 are provided in the vertical direction of the paper surface. The control element die pad 13 is a part of the lead frame 9.

In an IC die bonding process in step S3, as shown in FIG. 3, a high voltage IC 10 and a low voltage IC 11 are placed on a die pad to electrically connect to the die pad. Note that the high voltage IC 10 and the low voltage IC 11 each correspond to the IC 5 shown in FIG. 1.

In a wire bonding process in step S4, as shown in FIG. 3, electrical connections are made, with the wire 7, between the power chips 2 and the free wheel diodes 3, the power chips 2 and the high voltage IC 10, the power chips 2 and the low voltage IC 11, the high voltage IC 10 and the bootstrap diodes 6, and the like.

In a transfer molding process in step S5, as shown in FIG. 3, the power chips 2, the free wheel diodes 3, the high voltage IC 10, the low voltage IC 11, and the bootstrap diodes 6 are encapsulated in the mold resin 8 such that tie bar portions 14 and 15 are exposed and each terminal protrudes outward.

After the transfer molding process, P1, P2, UP1, UP2, VP1, VP2, WP1, WP2, UN, VN, and WN terminals protrude outward from the same side of the mold resin 8. The P1 and P2 terminals are connected to one power chip die pad 12. The UP1 and UP2 terminals are connected to one power chip die pad 12. The VP1 and VP2 terminals are connected to one power chip die pad 12. The WP1 and WP2 terminals are connected to one power chip die pad 12. Note that the P1, P2, UP1, UP2, VP1, VP2, WP1, and WP2 terminals each correspond to the power-side terminal 1 shown in FIG. 1.

Further, VB(U), VS(U), VB(V), VS(V), VB(W), and VS(W) terminals protrude outward from the same side of the mold resin 8. Note that the VB(U), VS(U), VB(V), VS(V), VB(W), and VS(W) terminals each correspond to the control-side terminal 4 shown in FIG. 1.

The P1, P2, UP1, UP2, VP1, VP2, WP1, WP2, UN, VN, and WN terminals, and the VB(U), VS(U), VB(V), VS(V), VB(W), and VS(W) terminals protrude outward from the opposite side surfaces of the mold resin 8. That is, as shown in FIG. 3, the P1, P2, UP1, UP2, VP1, VP2, WP1, WP2, UN, VN, and WN terminals are arranged on one side of the lead frame 9 in plan view. Further, the VB(U), VS(U), VB(V), VS(V), VB(W), and VS(W) terminals are arranged on the other side of the lead frame 9 opposite to the one side in plan view.

In a tie bar cutting process in step S6, the tie bar portions 14 that connect between terminals including the P1, P2, UP1, UP2, VP1, VP2, WP1, WP2, UN, VN, and WN terminals are cut and removed to leave a tie bar portion 14 that connects the P1 and P2 terminals, a tie bar portion 14 that connects the UP1 and UP2 terminals, a tie bar portion 14 that connects the VP1 and VP2 terminals, and a tie bar portion 14 that connects the WP1 and WP2 terminals. That is, the tie bar portions 14 hatched in FIG. 3 are removed.

Further, tie bar portions 15 that connect between a plurality of terminals including the VB(U), VS(U), VB(V), VS(V), VB(W), and VS(W) terminals are cut and removed. That is, the tie bar portions 15 hatched in FIG. 3 are removed.

Figure 4:
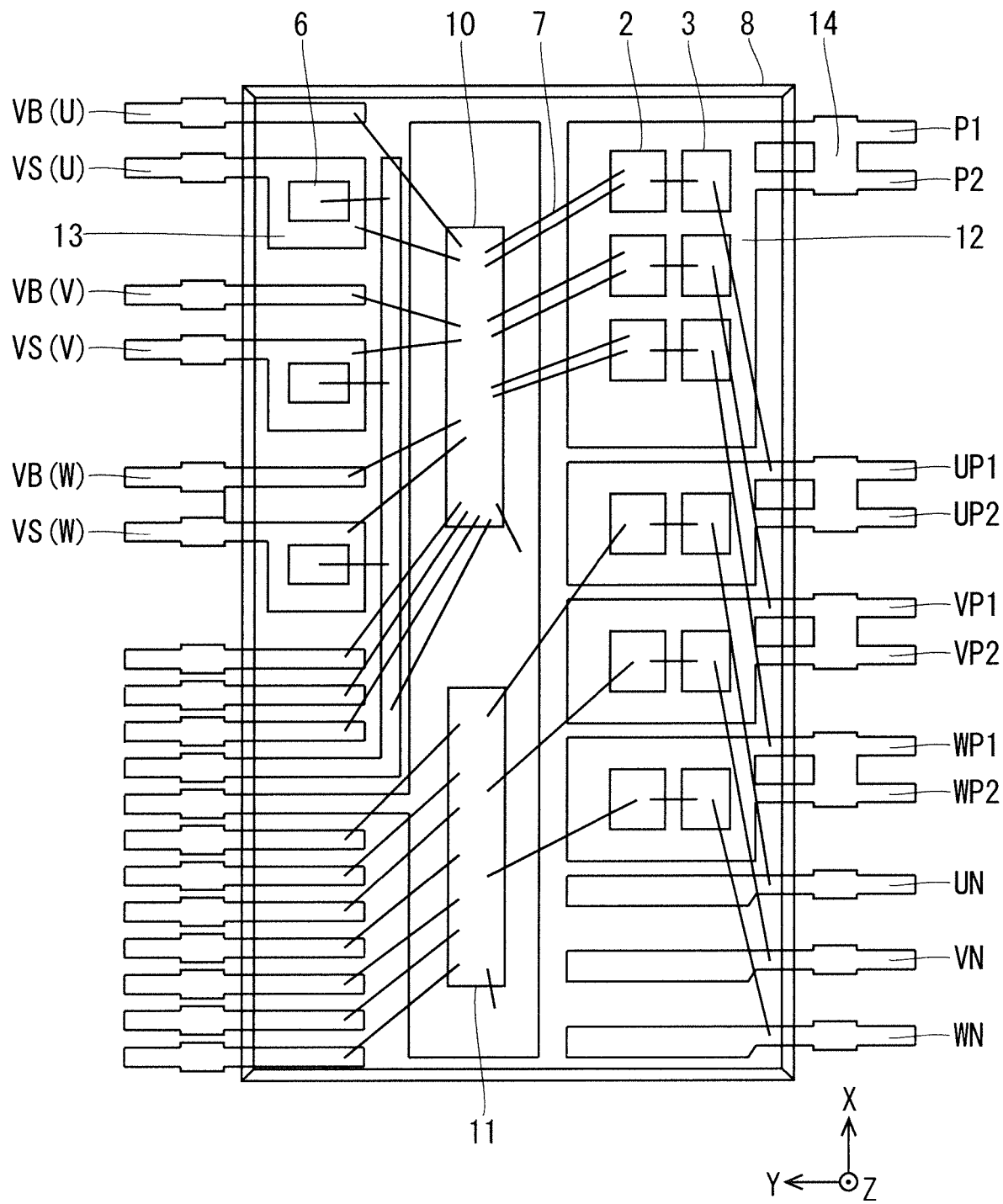

In a lead cutting process in step S7, an outer peripheral portion of the lead frame 9 is cut and removed. FIG. 4 is a plan view of an example of the semiconductor device after the lead cutting process. As shown in FIG. 4, the P1 and P2 terminals are connected by the tie bar portion 14, the UP1 and UP2 terminals are connected by the tie bar portion 14, the VP1 and VP2 terminals are connected by the tie bar portion 14, and the WP1 and WP2 terminals are connected by the tie bar portion 14. The other terminals individually protrude from the mold resin 8.

Figure 5:
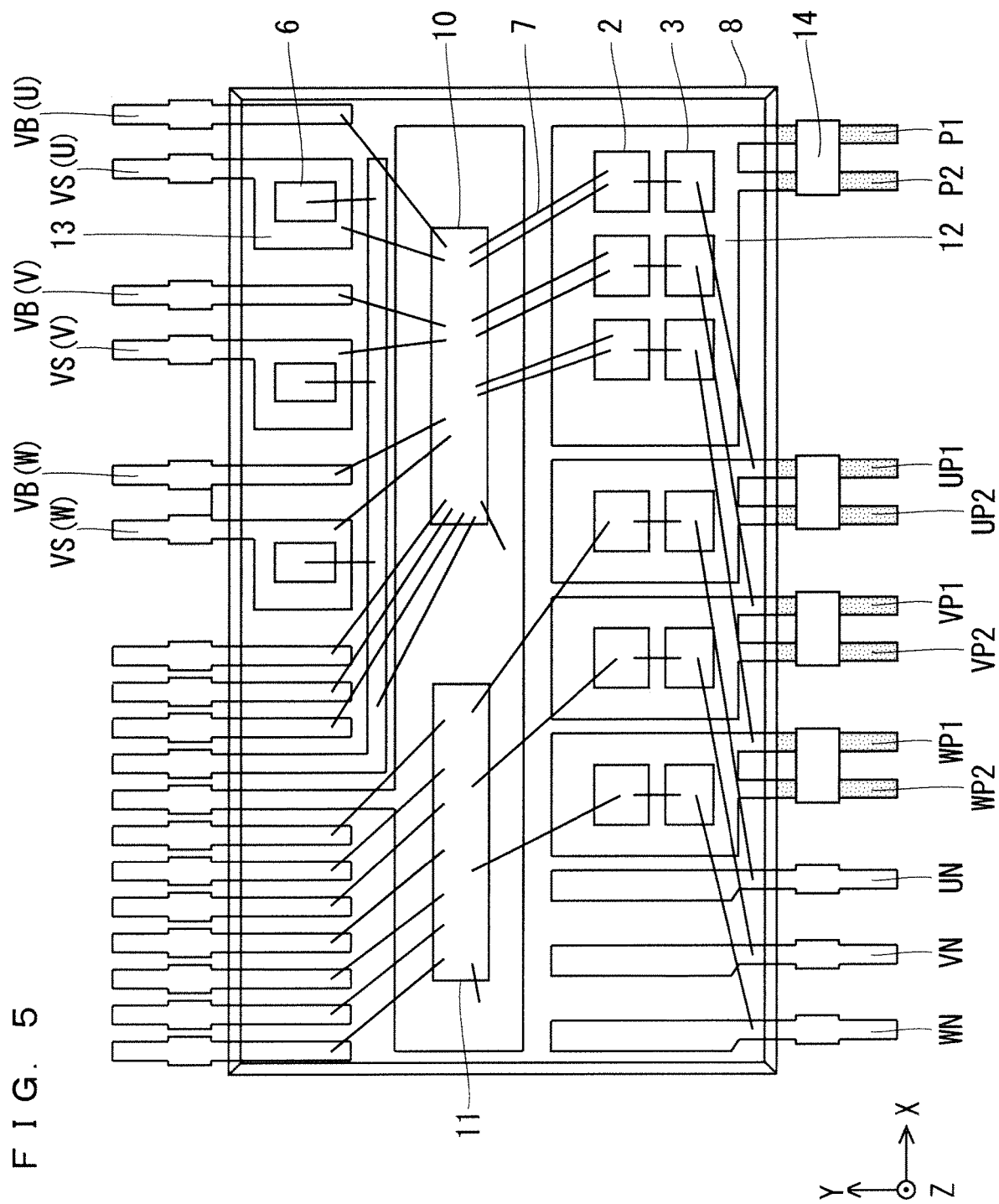

In a lead forming process in step S8, each of the terminals after the lead cutting process shown in FIG. 4 is bent into a desired shape. At this time, hatched portions of the P1, P2, UP1, UP2, VP1, VP2, WP1, and WP2 terminals shown in FIGS. 5 and 6 can be bent. As for the other terminals, there is no restriction on a portion to be bent.

Figure 7:
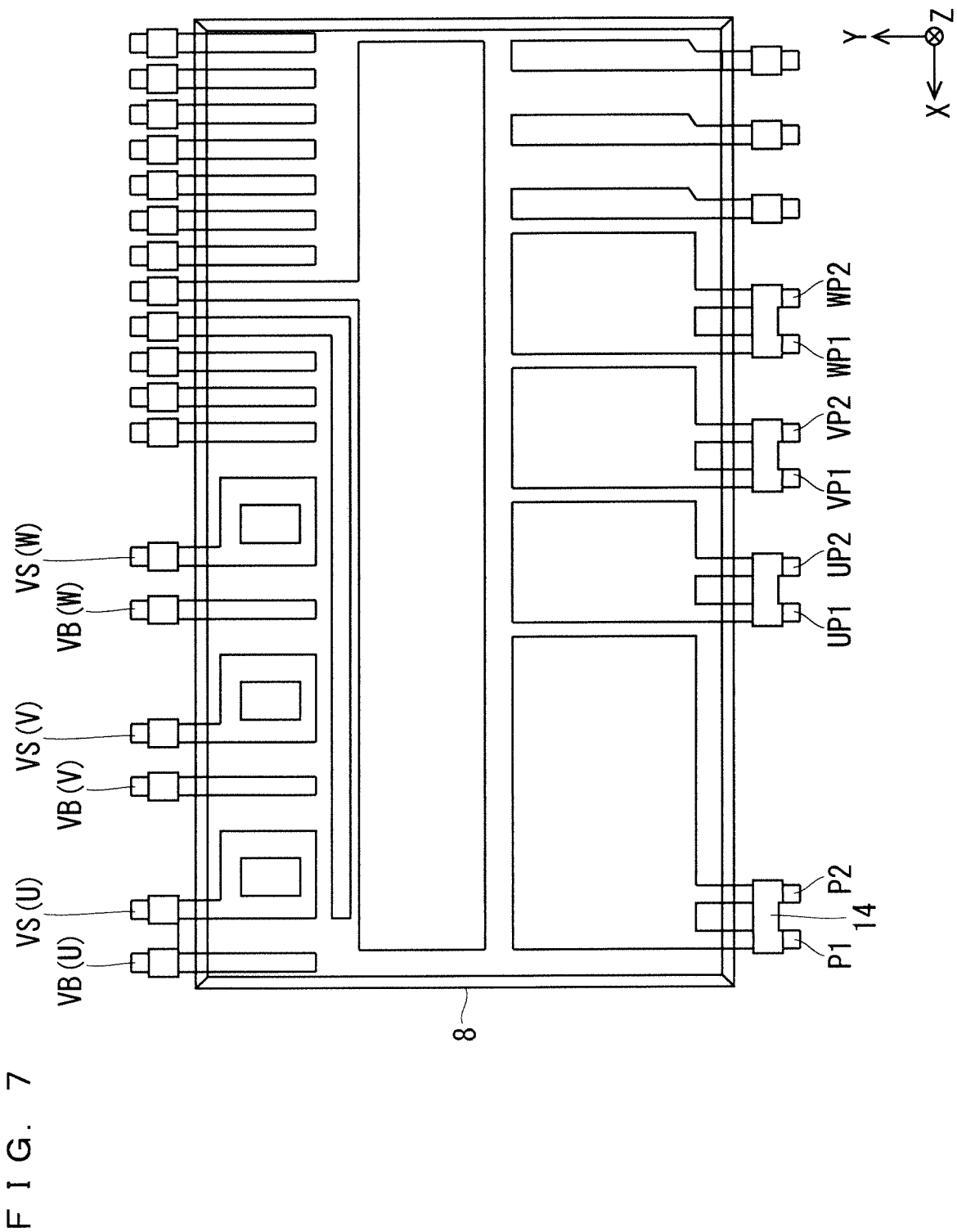
FIG. 7 is a plan view of the semiconductor device according to the first preferred embodiment of the present invention, showing the example of the process of manufacturing the semiconductor device.

FIGS. 7 and 8 show an example of the semiconductor device after the lead forming process. Note that FIG. 7 shows the semiconductor device as viewed from a back side of the paper surface of FIG. 5. As shown in FIG. 7, the P1 and P2 terminals, the UP1 and UP2 terminals, the VP1 and VP2 terminals, and the WP1 and WP2 terminals are each connected by the tie bar portion 14.

As described above, according to the first preferred embodiment, two power-side terminals 1 are connected to each power chip die pad 12, which makes it possible to reduce flutters of the power chip die pad 12 that occur when encapsulation in the mold resin 8 is made in the transfer molding process in step S5 shown in FIG. 2. This in turn makes it possible to reduce a thickness of resin (not shown) provided on a lower side of the power chip die pad 12 and thus increase heat dissipation.

Since the P1 and P2 terminals, the UP1 and UP2 terminals, the VP1 and VP2 terminals, and the WP1 and WP2 terminals are each connected by the tie bar portion 14, current-carrying capacity is increased.

Since the P1 and P2 terminals, the UP1 and UP2 terminals, the VP1 and VP2 terminals, the WP1 and WP2 terminals are each connected by the tie bar portion 14, the P1, P2, UP1, UP2, VP1, VP2, WP1, and WP2 terminals can each have a desired thickness. This in turn makes it possible to set thicknesses of the portions to be bent of the P1, P2, UP1, UP2, VP1, VP2, WP1, and WP2 terminals equal to each other and thus increase workability.

Since the P1 and P2 terminals, the UP1 and UP2 terminals, the VP1 and VP2 terminals, and the WP1 and WP2 terminals are each connected by the tie bar portion 14, it is easy to set the thickness of the power-side terminals 1 and the thickness of the control-side terminals 4 equal to each other. This makes it possible to set the number of the power-side terminals 1 and the number of the control-side terminals 4 close to each other, so that, when the semiconductor device is mounted on a substrate, a uniform stress is applied to both the power-side terminals 1 and the control-side terminals 4, or solder is uniformly fused at the power-side terminals 1 and the control-side terminals 4, which allows the semiconductor device to be more suitably mounted on the substrate.

Second Preferred Embodiment

A second preferred embodiment is characterized in that the tie bar portions 14 that connect the P1 and P2 terminals, the UP1 and UP2 terminals, the VP1 and VP2 terminals, and the WP1 and WP2 terminals are cut and removed in the tie bar cutting process in step S6 shown in FIG. 2. The second preferred embodiment is identical in other structures of the semiconductor device and method for manufacturing the semiconductor device to the first preferred embodiment; thus, no detailed descriptions will be given below of the other structures of the semiconductor device and the method for manufacturing the semiconductor device.

Figure 9:
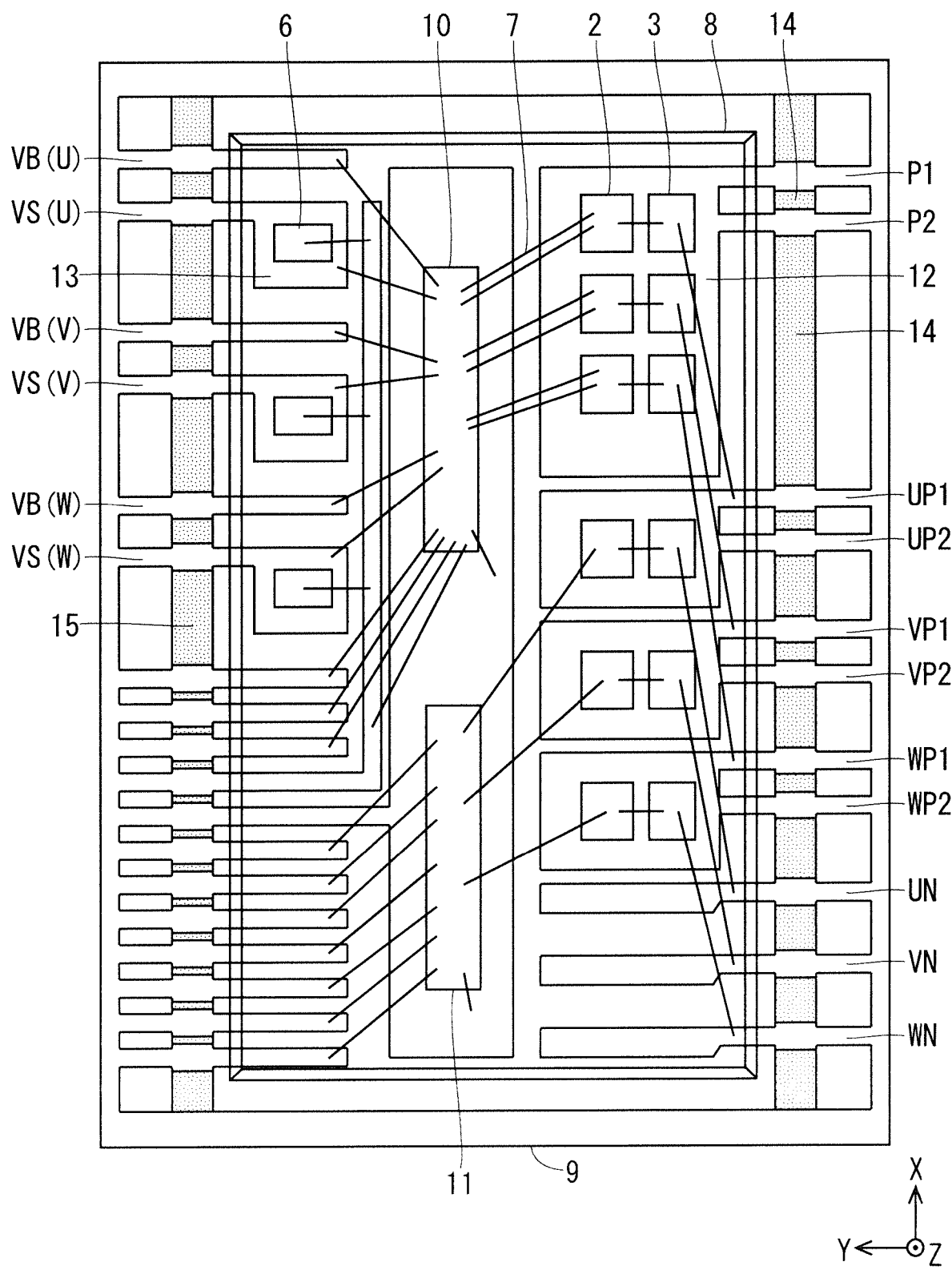
FIGS. 9 to 11 are plan views of a semiconductor device according to a second preferred embodiment of the present invention, showing an example of a process of manufacturing the semiconductor device.

FIG. 9 is a plan view of the semiconductor device according to the second preferred embodiment, showing an example of a process of manufacturing the semiconductor device, specifically, an example of the tie bar cutting process.

As shown in FIG. 9, in the tie bar cutting process, the tie bar portions 14 that connect between terminals including the P1, P2, UP1, UP2, VP1, VP2, WP1, WP2, UN, VN, and WN terminals are cut and removed. That is, the tie bar portions 14 hatched in FIG. 9 are removed.

Further, tie bar portions 15 that connect between a plurality of terminals including the VB(U), VS(U), VB(V), VS(V), VB(W), and VS(W) terminals are cut and removed. That is, the tie bar portions 15 hatched in FIG. 9 are removed.

Figure 10:
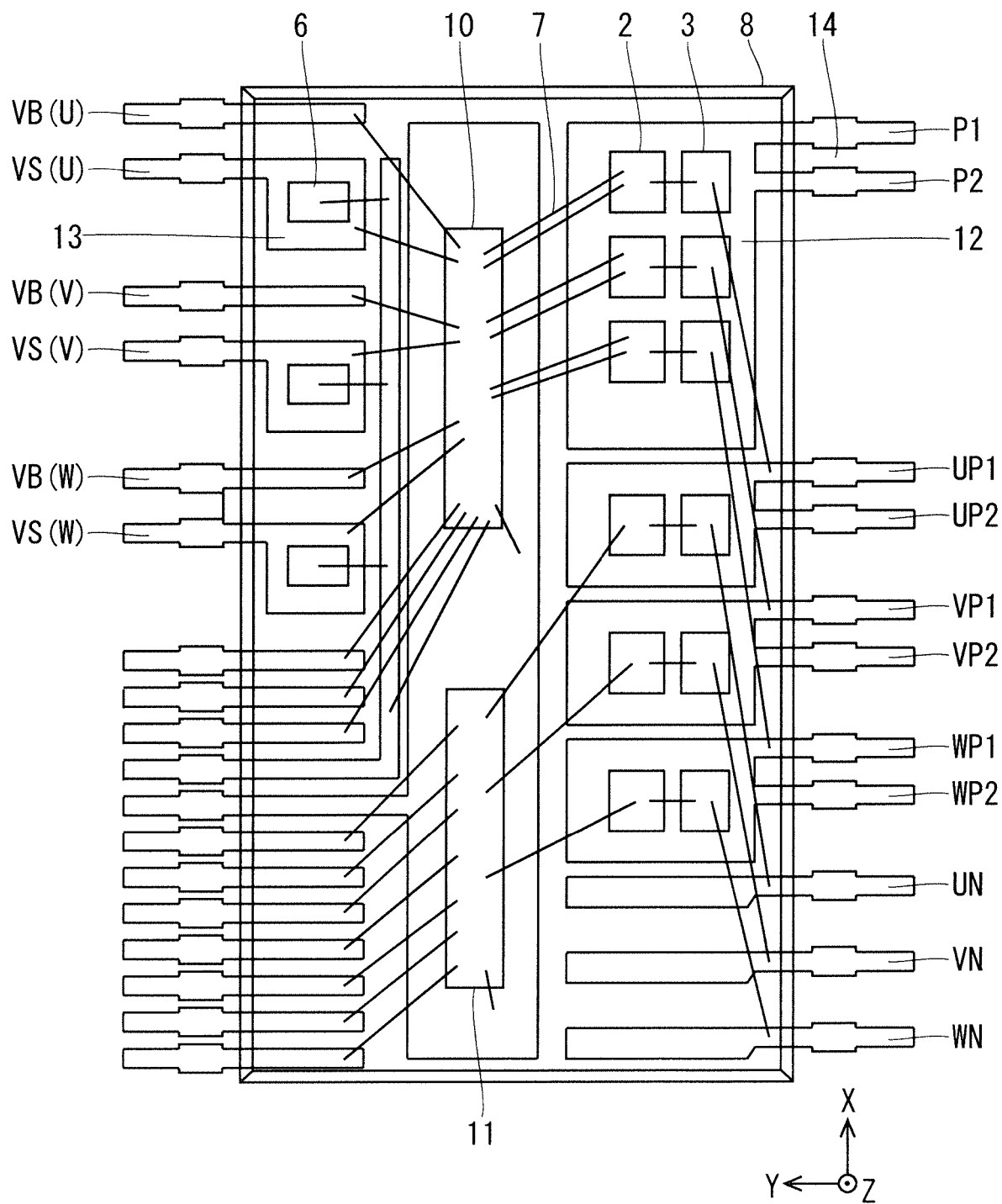

After the tie bar cutting process, the outer peripheral portion of the lead frame 9 is cut and removed in the lead cutting process in step S7 shown in FIG. 2. FIG. 10 is a plan view of an example of the semiconductor device after the lead cutting process. As shown in FIG. 10, the terminal individually protrudes from the mold resin 8.

Figure 11:
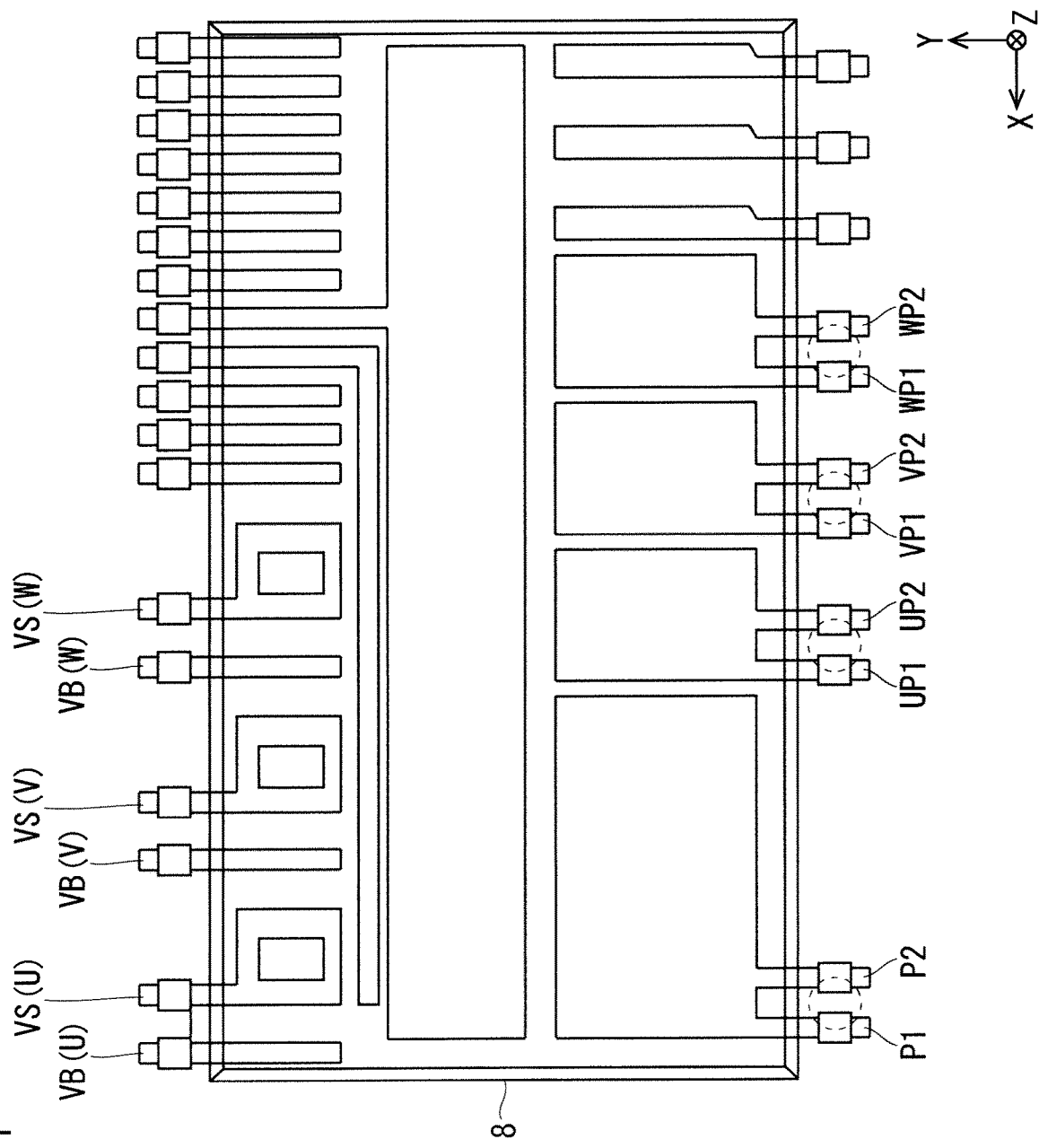
Figure 12:
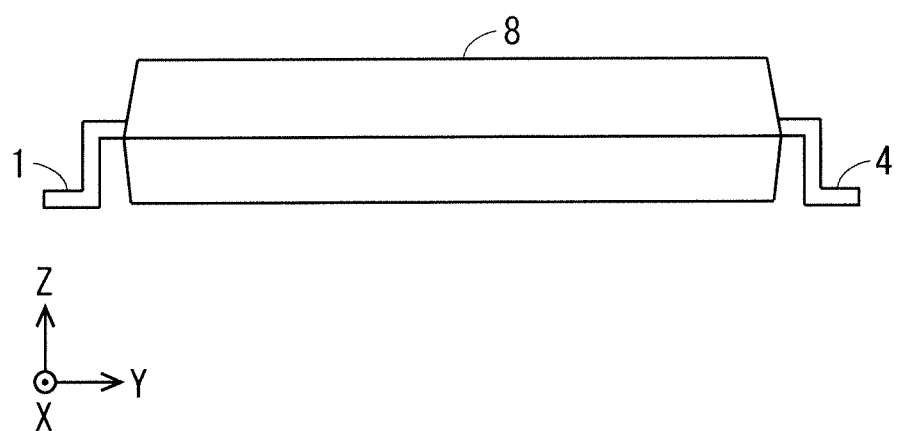
FIG. 12 is a side view of an example of the semiconductor device according to the second preferred embodiment of the present invention.

FIGS. 11 and 12 show an example of the semiconductor device after the lead forming process in step S8 shown in FIG. 2. Note that FIG. 11 shows the semiconductor device as viewed from a back side of the paper surfaces of FIGS. 9 and 10. The P1, P2, UP1, UP2, VP1, VP2, WP1, WP2, UN, VN, and WN terminals after the tie bar cutting process each have a tie bar cut mark, formed in the tie bar cutting process, at a portion represented by a dashed circle shown in FIG. 11.

As described above, according to the second preferred embodiment, the terminals are not connected by the tie bar portions 14, which makes it possible to bend the terminals more easily in the lead forming process in step S8 shown in FIG. 2. In particular, as for the P1, P2, UP1, UP2, VP1, VP2, WP1, and WP2 terminals, there is a restriction on the portion to be bent according to the first preferred embodiment, but there is no restriction on the portion to be bent according to the second preferred embodiment.

The terminals are not connected by the tie bar portions 14, so that, when the semiconductor device is mounted on the substrate, a uniform stress is applied to both the power-side terminals 1 and the control-side terminals 4, or solder is uniformly fused at the power-side terminals 1 and the control-side terminals 4, which allows the semiconductor device to be more suitably mounted on the substrate.

Third Preferred Embodiment

In the first and second preferred embodiments, a configuration where the semiconductor device serves as a power semiconductor device used in high-power applications has been described. In a third preferred embodiment, a semiconductor device that is not used in high-power applications will be described. Specifically, the third preferred embodiment is characterized in that the P2, UP2, VP2, and WP2 terminals serve as dummy terminals that are not current-carrying terminals. The third preferred embodiment is identical in other structures of the semiconductor device and method for manufacturing the semiconductor device to the first or second preferred embodiment; thus, no detailed descriptions will be given below of the other structures of the semiconductor device and the method for manufacturing the semiconductor device.

Figure 13:
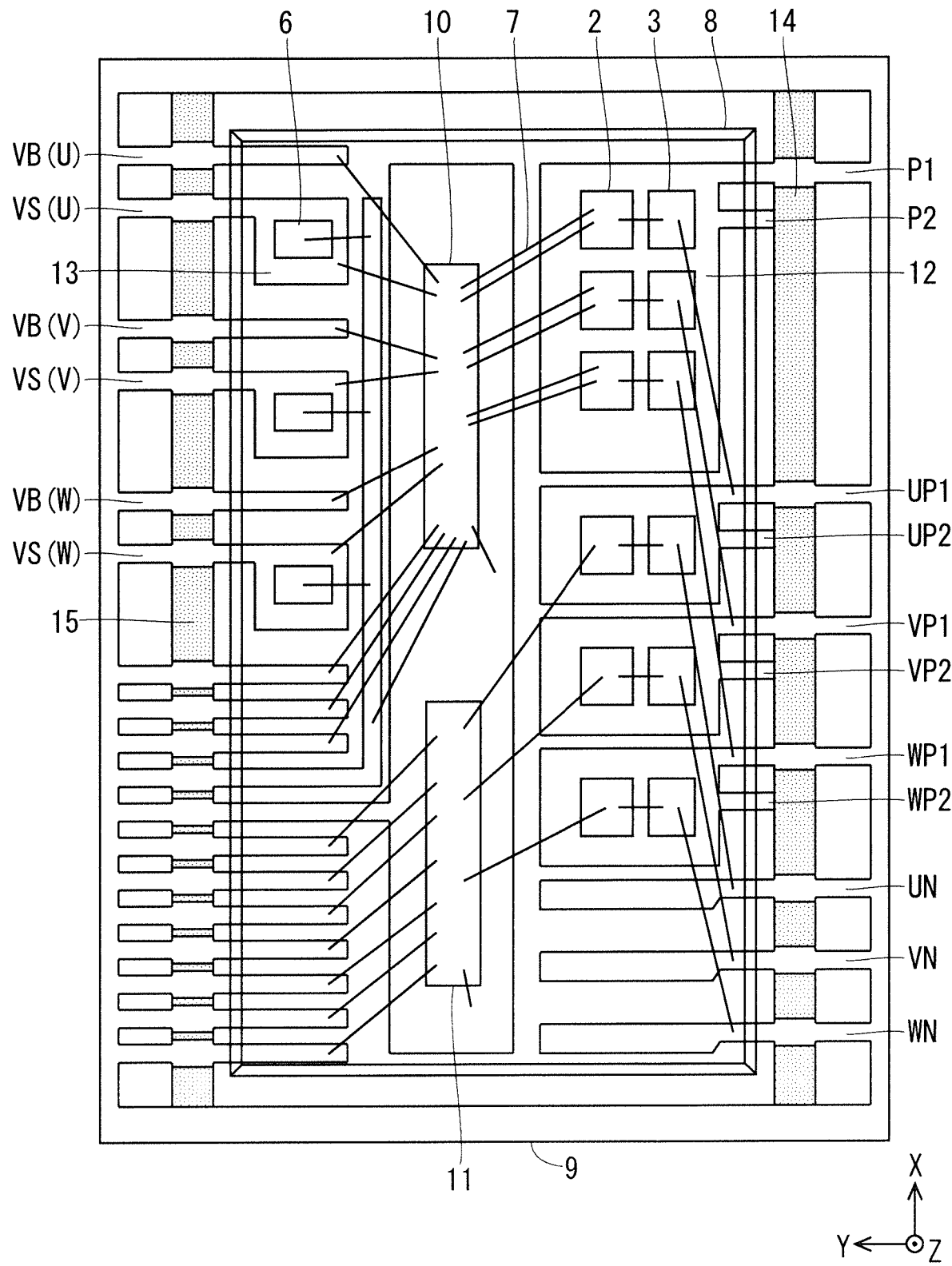
FIGS. 13 to 15 are plan views of a semiconductor device according to a third preferred embodiment of the present invention, showing an example of a process of manufacturing the semiconductor device.

FIG. 13 is a plan view of the semiconductor device according to the third preferred embodiment, showing an example of a process of manufacturing the semiconductor device, specifically, an example of the tie bar cutting process.

As shown in FIG. 13, the P2, UP2, VP2, and WP2 terminals are dummy terminals shorter than the P1, UP1, VP1, and WP1 terminals. In the tie bar cutting process, the tie bar portions 14 that connect between terminals including the P1, P2, UP1, UP2, VP1, VP2, WP1, WP2, UN, VN, and WN terminals are cut and removed. That is, the tie bar portions 14 hatched in FIG. 13 are removed.

Further, tie bar portions 15 that connect between a plurality of terminals including the VB(U), VS(U), VB(V), VS(V), VB(W), and VS(W) terminals are cut and removed. That is, the tie bar portions 15 hatched in FIG. 13 are removed.

Figure 14:
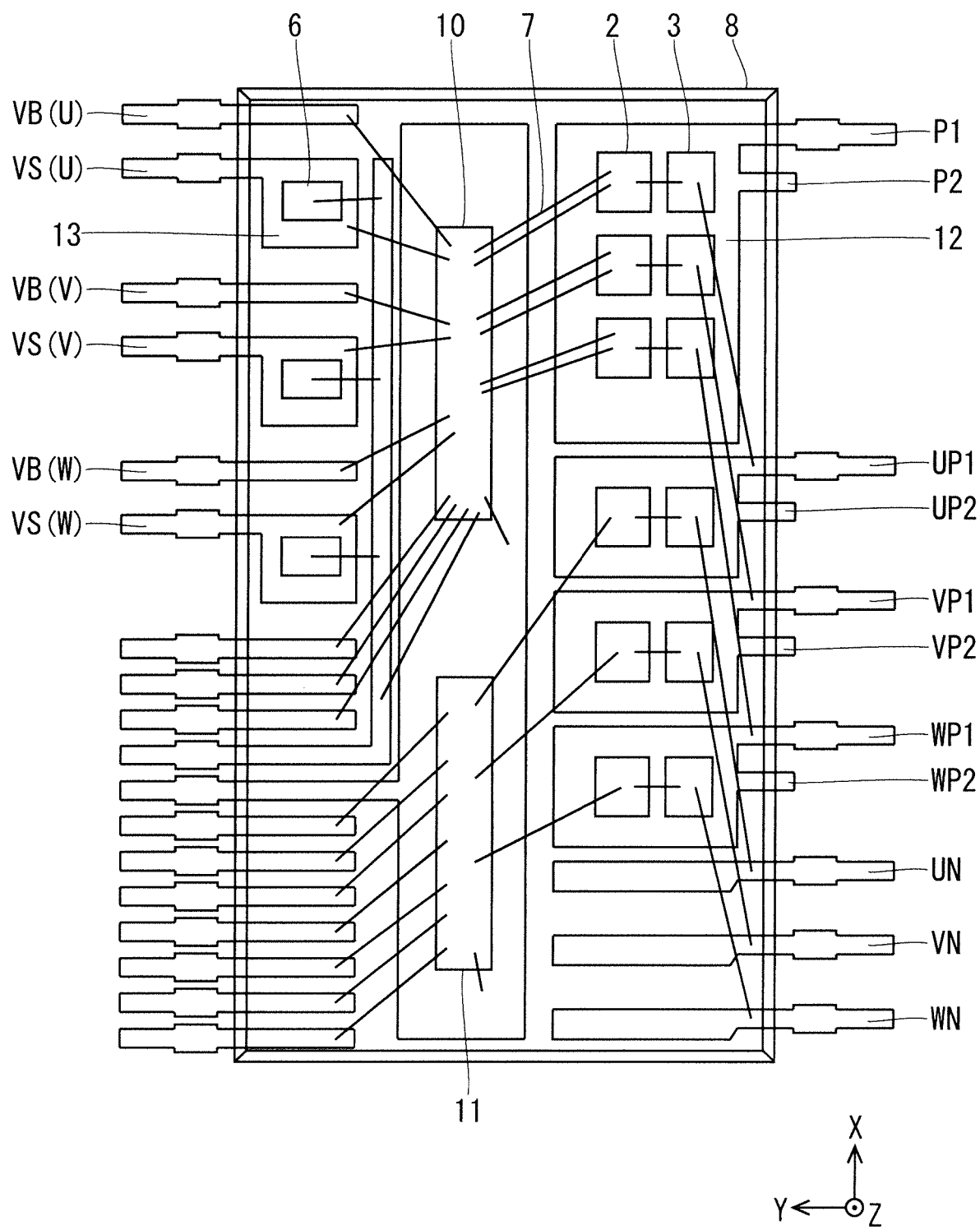

After the tie bar cutting process, the outer peripheral portion of the lead frame 9 is cut and removed in the lead cutting process in step S7 shown in FIG. 2. FIG. 14 is a plan view of an example of the semiconductor device after the lead cutting process.

Figure 15:
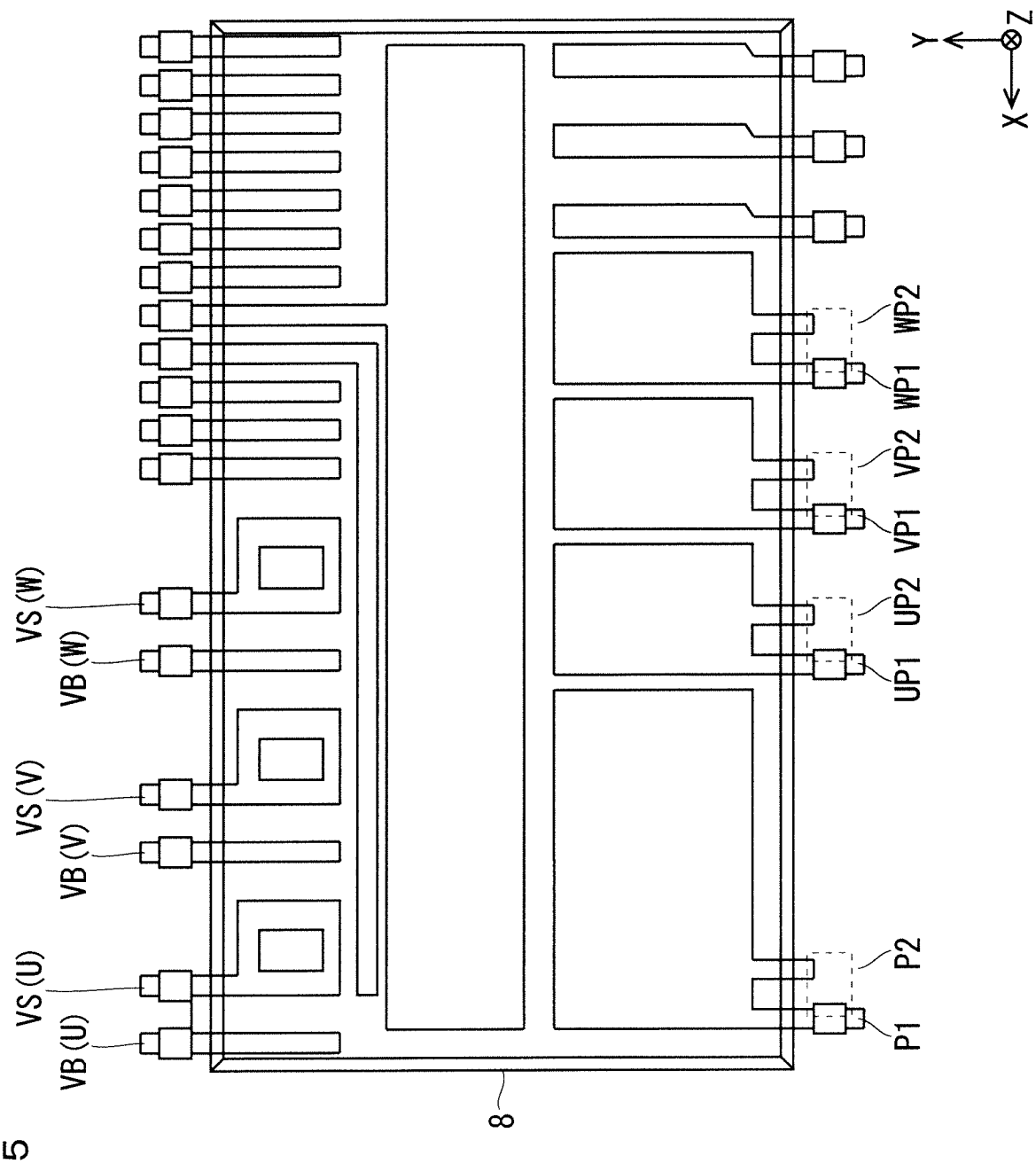
Figure 16:
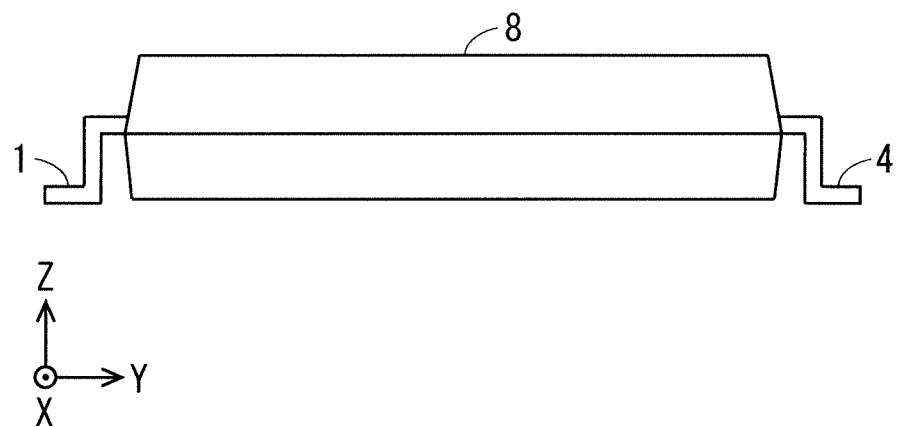
FIG. 16 is a side view of an example of the semiconductor device according to the third preferred embodiment of the present invention.

FIGS. 15 and 16 show an example of the semiconductor device after the lead forming process in step S8 shown in FIG. 2. Note that FIG. 15 shows the semiconductor device as viewed from a back side of the paper surfaces of FIGS. 13 and 14. The P1, P2, UP1, UP2, VP1, VP2, WP1, WP2, UN, VN, and WN terminals after the tie bar cutting process each have a tie bar cut mark, formed in the tie bar cutting process, at a portion represented by a dashed square shown in FIG. 15.

As described above, according to the third preferred embodiment, when sufficient current-carrying capacity can be secured even with one terminal connected to each power chip die pad 12, one of the two terminals connected to the power chip die pad 12 is made to serve as a dummy terminal, and such a dummy terminal is not used for mounting the semiconductor device on the substrate. This can prevent an unnecessary terminal from being disposed on the substrate.

In the lead forming process, the dummy terminal is not bent. That is, since the number of terminals that need to be bent is reduced by the number of dummy terminals, bending is facilitated.

Fourth Preferred Embodiment

A fourth preferred embodiment is characterized in that the power chips 2 and the free wheel diodes 3 included in the semiconductor device according to the first to third preferred embodiments are each formed of a wide band gap semiconductor. Herein, examples of the wide band gap semiconductor include SiC and GaN. The fourth preferred embodiment is identical in other structures of the semiconductor device and method for manufacturing the semiconductor device to any of the first to third preferred embodiments; thus, no detailed descriptions will be given below of the other structures of the semiconductor device and the method for manufacturing the semiconductor device.

Since the power chips 2 and the free wheel diodes 3 each formed of the wide band gap semiconductor have high breakdown voltage and high allowable current density, the power chips 2 and the free wheel diodes 3 can be downsized. Therefore, it is possible to downsize the semiconductor device including the power chips 2 and the free wheel diodes 3 that are downsized.

Since the power chips 2 and the free wheel diodes 3 each formed of the wide band gap semiconductor have high thermal stability, heat dissipation fins of a heat sink can be downsized.

Since the power chips 2 and the free wheel diodes 3 each formed of the wide band gap semiconductor have low power loss, the power chips 2 and the free wheel diodes 3 can be made more efficient, which in turn makes it possible to increase the efficiency of the semiconductor device.

Although it is desirable that both the power chip 2 and the free wheel diode 3 are formed of the wide band gap semiconductor, only one of the power chip 2 and the free wheel diode 3 may be formed of the wide band gap semiconductor, and, even with this structure, the same effect as described above can be obtained.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, the method comprising the steps of:
    (a) preparing a lead frame including a switching element die pad to which two terminals are connected, the two terminals being disposed on a first side in plan view, a control element die pad to which one terminal is connected, the one terminal being disposed on a second side opposite to the first side, and tie bar portions connecting between a plurality of terminals including at least the two terminals;
    (b) placing a switching element and a diode element on the switching element die pad and placing, on the control element die pad, a control element configured to control the switching element;
    (c) encapsulating the switching element, the diode element, and the control element in a mold resin such that the tie bar portions are exposed and a plurality of terminals including the two terminals and the one terminal protrude outward; and
    (d) removing all the tie bar portions, wherein
    a first terminal of the two terminals is a dummy terminal shorter than a second terminal of the two terminals in the step (d), and
    the two terminals have tie bar cut marks.

2. The method for manufacturing a semiconductor device according to claim 1, wherein at least one of the switching element and the diode element is formed of a wide band gap semiconductor.

3. A semiconductor device comprising:
    a switching element and a diode element placed on a switching element die pad to which two terminals are connected, the two terminals being disposed on a first side in plan view, a first terminal of the two terminals being a dummy terminal shorter than a second terminal of the two terminals, and the two terminals having tie bar cut marks;
    a control element placed on a control element die pad to which one terminal is connected, the control element being configured to control the switching element, the one terminal being disposed on a second side opposite to the first side; and
    a mold resin encapsulating the switching element, the diode element, and the control element such that the two terminals having tie bar cut marks are exposed and a plurality of terminals including the two terminals and the one terminal protrude outward.

4. The semiconductor device according to claim 3, wherein at least one of the switching element and the diode element is formed of a wide band gap semiconductor.

5. A semiconductor device comprising:
    a switching element and a diode element placed on a switching element die pad to which two terminals are connected, the two terminals being disposed on a first side in plan view and a first terminal of the two terminals being a dummy terminal shorter than a second terminal of the two terminals;
    a control element placed on a control element die pad to which one terminal is connected, the control element being configured to control the switching element, the one terminal being disposed on a second side opposite to the first side; and
    a mold resin encapsulating the switching element, the diode element, and the control element to allow a plurality of terminals including the two terminals and the one terminal to protrude outward,
    wherein the two terminals have tie bar cut marks.

6. The semiconductor device according to claim 5, wherein at least one of the switching element and the diode element is formed of a wide band gap semiconductor.

* * * * *